United States Patent
Wei et al.

[11] Patent Number: 6,137,735
[45] Date of Patent: Oct. 24, 2000

[54] COLUMN REDUNDANCY CIRCUIT WITH REDUCED SIGNAL PATH DELAY

[75] Inventors: Fangxing Wei, Bensalem, Pa.; Hirohito Kikukawa, Hirakata, Japan; Cynthia Mar, Nepean, Canada

[73] Assignees: Mosaid Technologies Incorporated, Kanata, Canada; Matsushita Electric Industrial Co., Ltd., Osaka, Japan

[21] Appl. No.: 09/182,495

[22] Filed: Oct. 30, 1998

[51] Int. Cl.[7] .................................................... G11C 7/00
[52] U.S. Cl. ................. 365/200; 365/230.03; 365/230.06
[58] Field of Search ............................. 365/200, 230.03, 365/230.06, 230.05

[56] References Cited

U.S. PATENT DOCUMENTS

| | | | |
|---|---|---|---|
| 4,691,301 | 9/1987 | Anderson | 365/200 |
| 5,394,368 | 2/1995 | Miyamoto | 365/200 |
| 5,621,691 | 4/1997 | Park | 365/200 |
| 5,646,896 | 7/1997 | Pinkham | 365/200 |
| 5,657,279 | 8/1997 | Savignac et al. | 365/200 |
| 5,675,543 | 10/1997 | Rieger | 365/200 |
| 5,732,030 | 3/1998 | Dorney | 365/200 |
| 5,787,046 | 7/1998 | Furuyama et al. | 365/230.03 |

*Primary Examiner*—David Nelms
*Assistant Examiner*—Ahn Phung
*Attorney, Agent, or Firm*—Kevin Pillay; John R.S. Orange; Santosh K. Chari

[57] ABSTRACT

The invention discloses a synchronous DRAM having memory elements arranged in rows and columns, the memory elements being accessible by decoding a memory address applied thereto, normal column drivers for activating appropriate memory elements in response to decoded column addresses signals; redundant column drivers distributed throughout memory banks and flexibly selectable to replace faulty columns within multiple blocks within a bank; and switch means for selectively activating the redundant column and preventing the activation of a defective normal column, whereby the column redundancy method and apparatus minimizes the timing difference between a normal and redundant column paths and which minimizes the number of fuses required to be blown in repairing faulty columns addresses.

7 Claims, 10 Drawing Sheets

COLUMN REDUNDANCY CIRCUIT WITH REDUCED SIGNAL PATH DELAY

This invention relates to semiconductor memories and in particular to semiconductor memories having a flexible and efficient circuit for substituting redundant columns for defective columns.

BACKGROUND OF THE INVENTION

Semiconductor dynamic random access memories (DRAMs) are typically formed of wordlines and columns crossing the wordlines. Capacitors adjacent each crossing of the rowlines and columns store charge, designating the data to be stored. The capacitors are coupled to the columns by an access transistor in order to receive or discharge charge upon receipt of an appropriate voltage on the rowlines. The rowlines and columns are selected so as to read and write to particular capacitors by means of row (or X) decoders and columns (or Y) decoders.

There are sometimes physical faults associated with the columns or associated elements. For this reason, RAMs usually contain redundant (spare) columns which involve the provision of extra memory elements and column circuitry. The extra memory and required redundant decoders to access that memory in place of defective columns uses valuable semiconductor chip area and decreases the area efficiency of the memory.

Various techniques have been implemented to provide column redundancy schemes in synchronous dynamic random access memories (SDRAMs). Amongst these are the address compare approach, the address detector approach, the shifter approach, and the address or data steering approach as well as combinations thereof. For example, in a first of these techniques utilizes an Y address comparator, wherein predecoded Y address signals (PY1:N) pass through fuses to generate redundant column enable signals (RCE) as illustrated in FIG. 1. The fuses associated with the redundancy comparator 2 having inherent capacitance and resistance add an extra delay in the Y redundant path.

A second technique involves an Y address detector 4 wherein Y address signals (AY(N-1:0) control NMOS gates that connect to a pre-charged node through fuses and each can generate redundant column enable signals as shown in FIG. 2. When a Y address matches a fuse programming pattern, a column redundant enable signal (COL_RED_EN) is maintained high in order to indicate that the column corresponding to the current Y address will be replaced by a redundant one. Because of this redundancy detecting circuit, timing between the normal and the redundant column path is usually different. Additional logic circuits are required to adjust the timing difference, i.e. a time delay circuit must be employed in the normal address signal path in order to compensate for the slower redundant path.

A further technique known as a shift replacement Y decoder utilizes fuses in the Y decoders but not connected in the signal path. Generally, two Y select lines share one group of fuses. In order to replace a column, the column is disabled by blowing the fuse inside the Y decoder. Shifting the Y driver access for the defective block over to an adjacent driver completes replacement. An advantage of this system is that since fuses are not connected in the column address path, no difference in timing between the normal and redundant path exists. Furthermore, block replacement is possible (failed columns can be repaired in each block with different decoding of each block). A disadvantage of this system is that two adjacent Y select lines must be replaced at the same time making this technique less flexible than other techniques. Furthermore, one directional shifting is required of the columns.

In FIG. 3, a redundancy circuitry 10 is implemented which uses an address steering approach according to an embodiment of the invention in U.S. patent application Ser. No. 08/904,153 to Chen et al. assigned to MOSAID Technologies Inc. In this approach, each Y decoder consists of an NMOS multiplexer 12 which steers the column select signal either down the normal or redundant paths according to the information programmed in the fuse circuit 14. NMOS transistors are used in conjunction with an on-chip boosted voltage supply VPP to select the appropriate path since the NMOS transistors in the multiplexer require a voltage larger than VDD to fully turn them on. The redundant select line RYSEL 16 is long and exhibits considerable RC delay. In this implementation two redundant column drivers are accessible by 64 normal columns, but the redundant drivers are dedicated to replacing faulty columns only in that block and can not be used to replace faulty columns in any other blocks within a quadrant. This lack of flexibility proves to be intolerable when moving from the 64M SDRAM density to the 256M SDRAM density. Furthermore, the length of the RYSEL line 16 makes such a design too slow for the 256M generation SDRAM.

Thus, it may be seen that there is a need for a redundancy scheme that reduces the timing difference between normal and redundant column paths and which reduces the number of fuses and provides greater flexibility in repairing faulty columns and is capable of accommodating the speed requirements of large memories.

SUMMARY OF THE INVENTION

This invention seeks to provide a column redundancy method and apparatus in a semiconductor memory that minimizes the timing difference between a normal address path and a redundant column address path and which minimizes the number of fuses required to be blown in repairing faulty columns.

In accordance with this invention, there is provided a semiconductor memory device comprising:
 a) a plurality of normal memory columns selectively enabled by normal column decoders;
 b) redundant memory columns selectively enabled by redundant column decoders, the normal and redundant decoders being responsive to a column clock signal; and
 c) local signal distribution circuitry for switching the column clock signal to either a normal driver or to the corresponding redundancy driver in response to an output from the redundant column decoder.

BRIEF DESCRIPTION OF THE DRAWINGS

A better understanding of the invention will be obtained by reference to the detailed description below in conjunction with the following drawings in which.

DETAILED DESCRIPTION OF A PREFERRED EMBODIMENT

Figure 4:
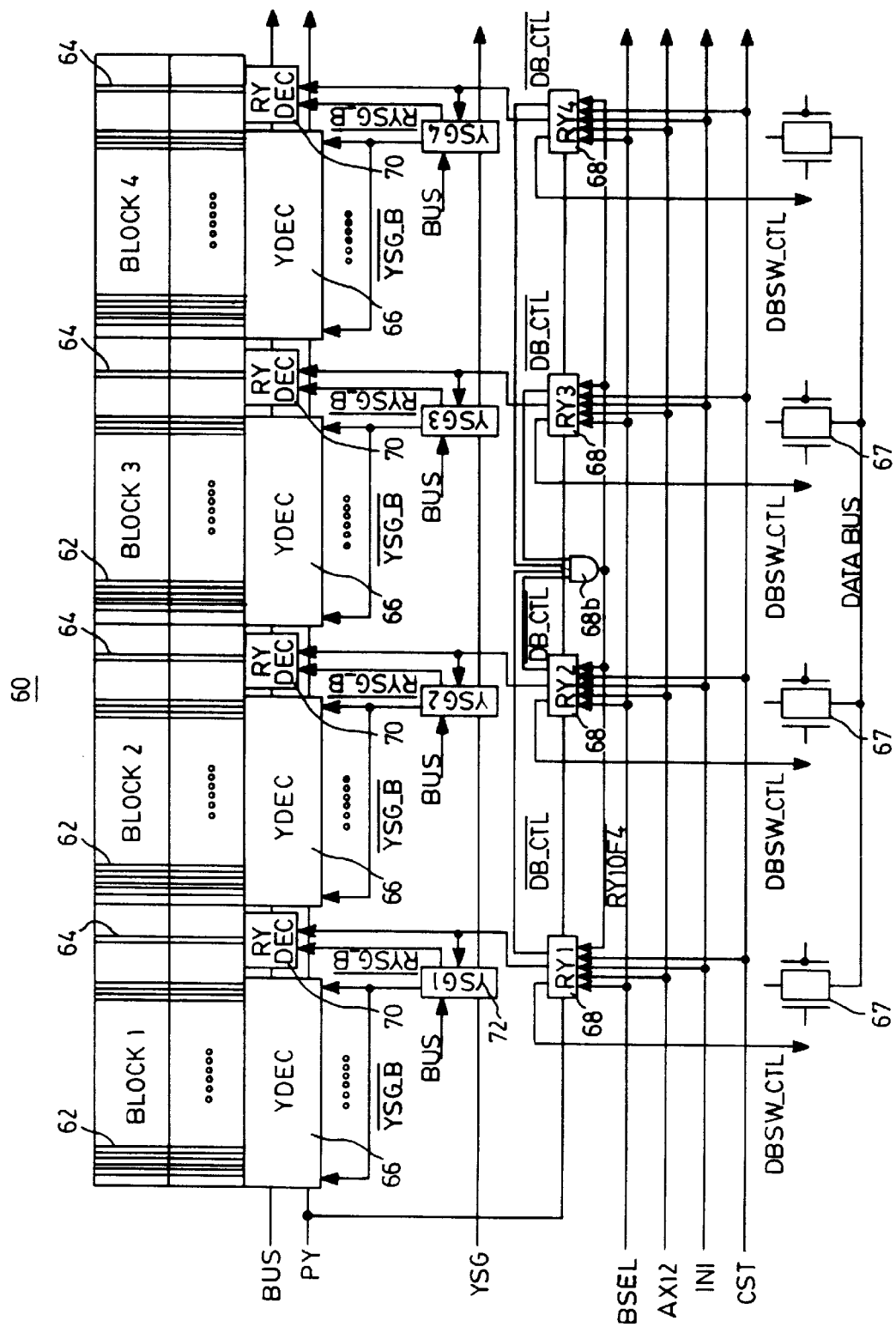
FIG. 4 is a plan view showing a layout for part of a semiconductor memory with a column redundancy scheme according to an embodiment of the present invention.

In the following description, like numerals refer to similar elements in the drawings. Referring to FIG. 4, the layout of a section of an SDRAM implementing a column redundancy scheme according to a general embodiment of the present invention, is shown by numeral 60. More specifically, the column redundancy scheme illustrated is that for a 256M (Mbit) SDRAM in which the memory chip is divided into four banks, with 16×32 blocks per bank, i.e. 16 blocks of rowlines and 32 blocks of columns. Each bank is physically separated into two half banks in the column direction by row decoders, with each half bank having sixteen (16) column blocks. Each block comprises sixty-four (64) normal columns 62 and one (1) redundant column. The section 60 shown has blocks numbered BLOCK1, BLOCK2, BLOCK3 and BLOCK4, and this layout is repeated four times for a half bank and eight times for an entire bank. The redundant column 64 associated with each block is shown at the right hand side thereof. Each block has a core Y decoder driver circuit YDEC 66 and (Note: core circuitry refers to circuitry that is physically and functionally associated with the memory array; the terms column and Y are used interchangeably) and a single core redundant decoder RY 68 and driver RYDEC 70. The core Y decoders 66 are the second stage of the overall Y decoding for the chip. The core Y decoder 66 gets its input from Y predecoder (not shown) outputs PY and completes the column decoding. The first stage of column decoding is performed by the Y predecoders which, from global column address signals ACL[0:8] (not shown), generate the following predecoded Y addresses: PY0_1_2(7:0), PY3_4(3:0), PY5_6(3:0), PY7_8(3:0). All of these addresses are shown generally in FIG. 4 as bus PY that carries the predecoded address signals to the core Y decoder 60 and core Y redundancy circuitry 70. Logic functions such as Y address latch, burst control, interleave control, sequential burst, interleave burst and Y address prefetch, all well-known in the SDRAM field, are all implemented in the Y predecoder circuit.

As described above, each block has one Y redundancy column 64 and decoder RY 68 located at the side of the block. The Y redundancy decoder and its corresponding BLOCK core Y decoder share the same block selection signal (BSEL). As a result, by changing the block selection signal BSEL, a redundant column in one block can be used to replace a faulty normal column in any adjacent four blocks within a bank, as will be described in further detail below. The core Y decoders 66 and the redundant column 64 are clocked by a common Y select clock signal YSG. The overall structure of the four related redundant Y decoders, their relations to the core Y decoders and core-I/Os are illustrated in FIG. 4.

Figure 10:
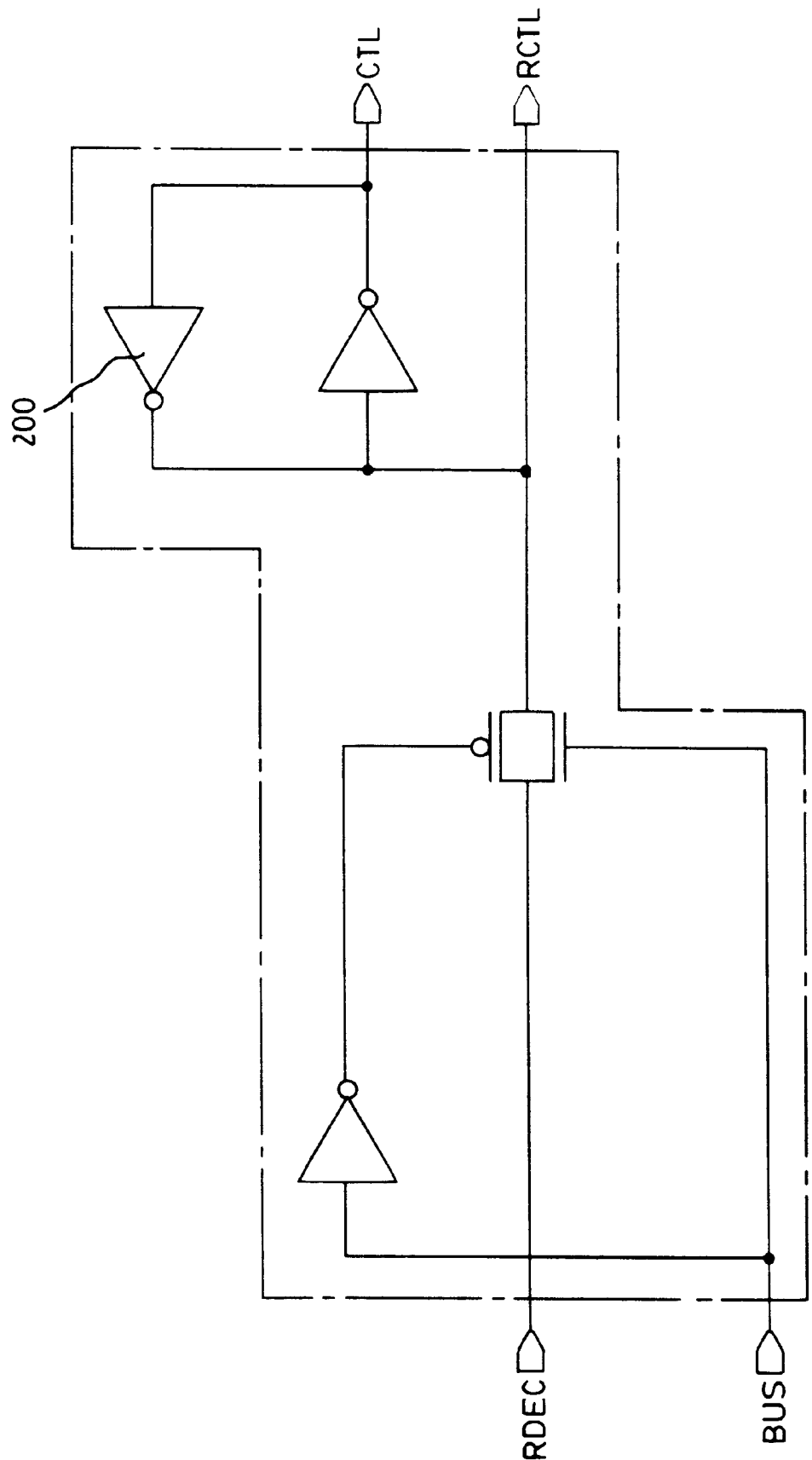
FIG. 10 is a schematic diagram of a redundant decoder latch according to an embodiment of the present invention.

In this embodiment, the YSG signals are distributed locally. The YSG signal drivers at the center of the bank pass YSG signals throughout an entire bank. Local YSG signal distribution circuitry, indicated as YSG1, YSG2, YSG3 etc., and shown in detail in FIG. 10, are provided for each block. Each of the local YSG signal distribution circuitry 72 switch and drive the YSG signal to either a normal core Y decoder 66 or to the corresponding Y redundancy decoder 68 in response to the output RDEC from the redundant Y decoder. The YSG signal distribution circuitry YSG1, YSG2, YSG3 etc. is clocked by BUSL and $\overline{BUSL}$ signals to latch its corresponding redundant Y decoder output RDEC for 2 clock cycles, as shown in FIG. 10. If the latched logic value is high, the YSG signals are switched to redundant Y decoder to drive the redundancy column 64. If the latched logic value is low, the YSG signals are switched to core Y decoder to drive the normal column.

Generally, four redundancy decoders within adjacent odd or even blocks are shared by all four blocks and can be used to replace any bad normal column within these four blocks. The $\overline{DB\_CTL}$ outputs of the redundant Y decoder are connected to a four input AND gate 68b. The output $\overline{RY10F4}$ from this gate is shared by the four redundancy decoders. Thus when a redundant Y decoder is working, its output signal $\overline{DB\_CTL}$ is set low, so $\overline{RY10F4}$ is set low to inform the core-I/O circuitry (core data path circuitry) that a redundant Y decoder is being used.

When a normal column is selected within a block, the BSEL signal goes high. The corresponding core-I/O needs to be enabled so core-I/O control signal DBSW_CTL goes high. If the selected normal column is bad, it can be replaced by a redundant Y decoder, either within or outside the current block. Under this failure case even if BSEL is still high, whether DBSW_CTL goes high or not depends on the position of the failure replacement. The DBSW_CTL signal is responsible for switching the appropriate data bus pass gates 67 for coupling the selected column data to the data bus. The $\overline{RY10F4}$, BSEL and $\overline{DB\_CTL}$ are all inputs to the redundant decoder described in FIG. 6, used to determine the output DBSW_CTL, which controls the core I/O switch. The core-I/O switch rule is shown in the following table:

| INPUTS | | | OUTPUT |
|---|---|---|---|
| $\overline{RY10F4}$ | BSEL | $\overline{DB\_CTL}$ | DBSW_CTL |
| 0 | 0 | 0 | 1 |
| | | 1 | 0 |
| 0 | 1 | 0 | 1 |
| | | 1 | 0 |
| 1 | 0 | 1 | 0 |
| 1 | 1 | 1 | 1 |

It may be noted that in the 256M SDRAM embodiment illustrated, there are two versions of all control signals and data buses, one marked as B0 and the other marked as B1. While B0 signals are active, B1 signals are precharging and while B1 signals are active, the B0 signals are precharging. Thus, hiding the precharge time for a higher speed operation. This dual data bus architecture is described in U.S. Pat. No. 5,416,743 assigned to MOSAID Technologies, which is hereby incorporated by reference. The BUSL and $\overline{BUSL}$ signals schedule the toggling between B0 and B1 signals.

Figure 5A:
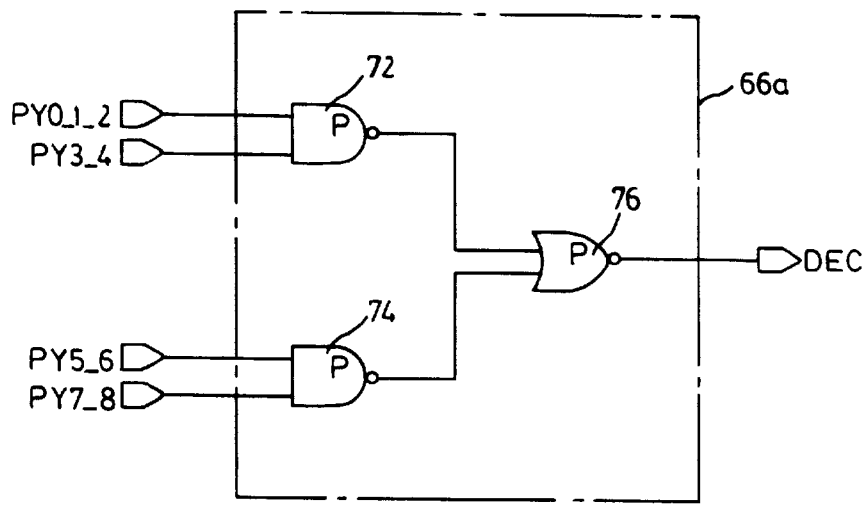
FIG. 5(a) is a schematic diagram of a normal column decoder according to an embodiment of the present invention.
Figure 5B:
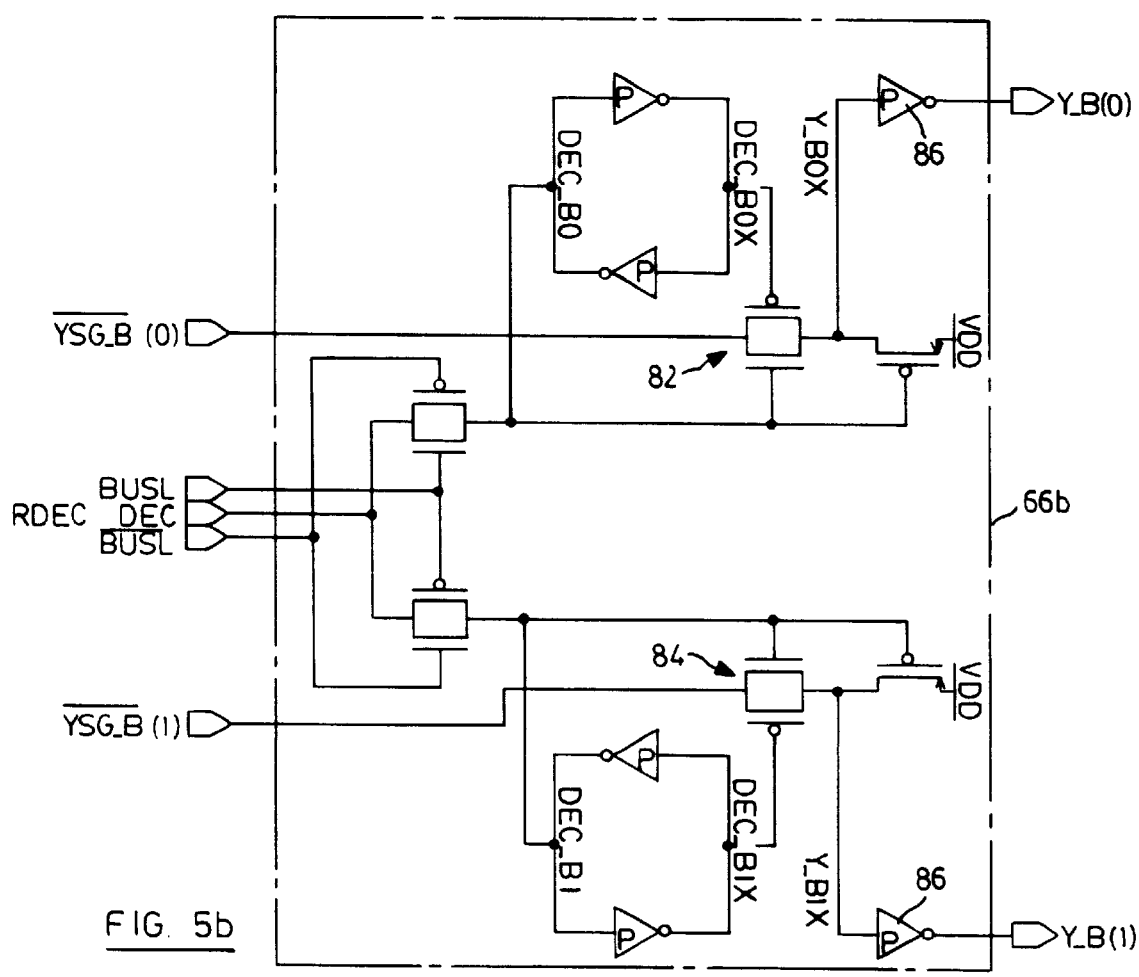
FIG. 5(b) is a schematic diagram of a column driver according to an embodiment of the present invention.

Referring now to FIGS. 5(a) and 5(b), a schematic diagram of the core Y decoder 66a and a Y driver 66b is shown. The combined circuit is shown schematically in block 66 of FIG. 4. The core Y decoder 66a comprises a pair of NAND gates 72 and 74 for receiving the Y predecoder outputs PY0_1_2, PY3_4, PY5_6 and PY7_8. The outputs from the NAND gates 72 and 74 are combined in a NOR gate 76 to provide decoded output signal DEC. The decoder circuit 66a is equivalent to a four input AND gate. The output from the core Y decoder DEC is coupled to the column driver circuit 66b as shown in FIG. 5(a).

The normal or redundant column driver 66b, receives the Y clock enable signals $\overline{YSG\_B0}$ and $\overline{YSG\_B1}$ at respective CMOS pass gates 82 and 84 which are controlled by the output signal DEC in conjunction with signals BUSL and $\overline{BUSL}$. The clock signals $\overline{YSG\_B0}$ and $\overline{YSG\_B1}$ are passed through the CMOS gates at the appropriate time to an inverter 86 which then drives the corresponding column with the signal Y_B0 or Y_B1, depending on the state of the BUSL or the $\overline{BUSL}$ signals. Thus, the decoded signal DEC controls the pass gates 82 and 84.

The overall core Y decoder YDEC 66 shown in FIG. 4 may be built with the two components shown in FIGS. 5(a) and 5(b). For example, if the Y address has nine bits, it then has 512 different decoding outputs. The even bits and odd bits may be separated to drive four even blocks and four odd blocks respectively. The arrangement will then repeat itself two times to realize a complete core wide decoder for a half bank or four times for a whole bank.

Figure 6:
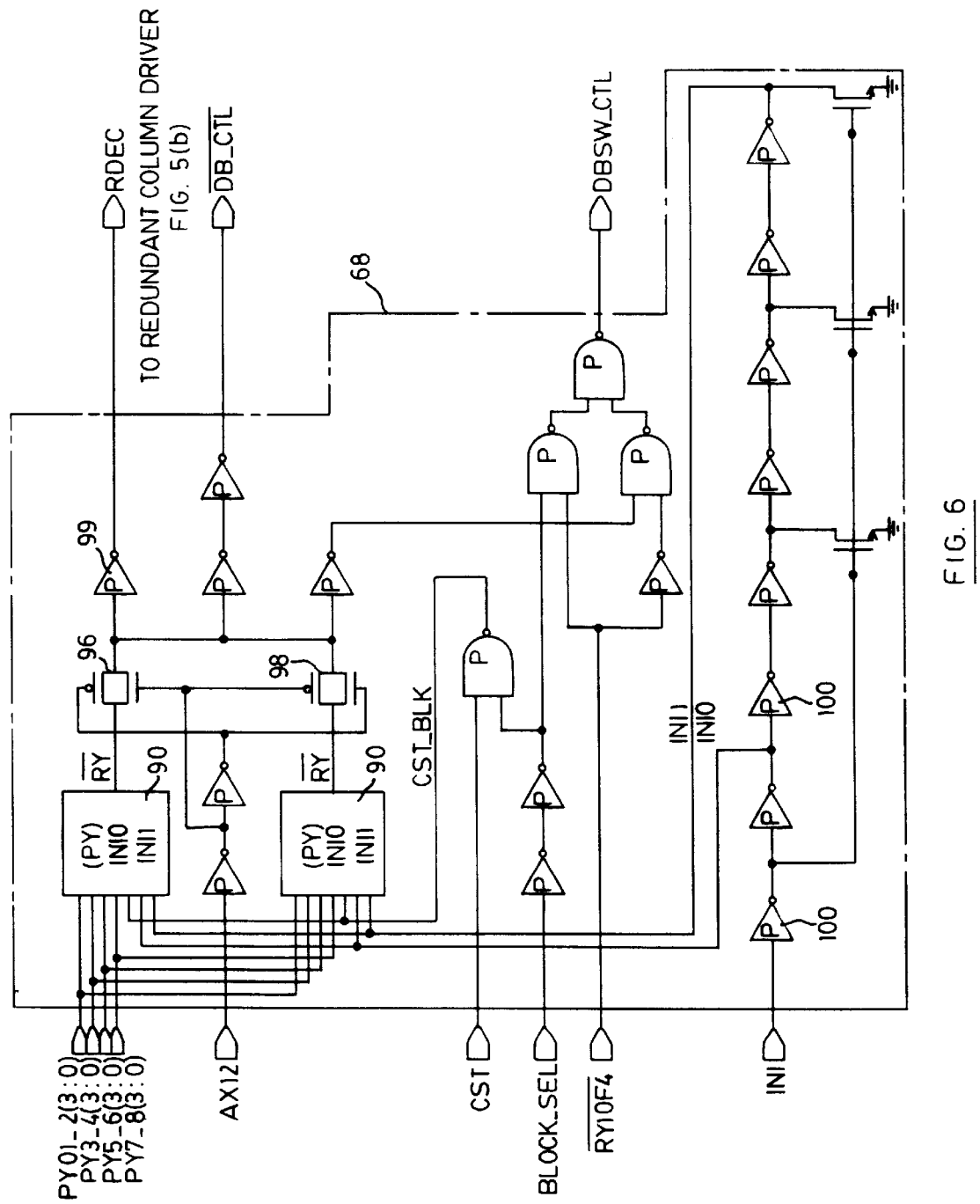
FIG. 6 is a schematic diagram of a redundant column decoder according to an embodiment of the present invention.

Turning now to FIG. 6, a detailed diagram of the redundancy decoder RY 68 of FIG. 4 is shown. The redundant Y decoders RY1, RY2, . . . RYN are used to determine if access to a redundant column is required. These redundant Y decoders utilize an address-compare scheme to make this determination. To reiterate, each memory block has one redundant column located at the side of the block. The redundancy decoder RY and its corresponding core Y decoder YDEC share the same block selection signal (BSEL). The redundancy decoder RY shown in FIG. 6 includes a pair of address-compare circuits 90 which receive the predecoded addresses PY0_1_2, PY3_4, PY5_6 and PY7_8. Each address-compare circuit 90 is capable of being programmed with a single address thus the redundant Y decoder is capable of being programmed to two redundant addresses. Details of the address compare circuitry 92 and 94 will be discussed with reference to FIG. 8.

Because normal columns may have separately addresses upper or lower portions within a block, a row address signal AX12 is provided to the redundant Y decoder to perform the upper or lower column portion selection. The row address signal AX12 is coupled to the control inputs of a pair of CMOS pass gates 96 and 98 which receive the respective outputs from the address-compare circuits 92 and 94. Thus, one redundant column can be used to replace an upper half of a normal column and a lower half of a normal column of two different addresses or vice versa. The $\overline{RY}$ signal is coupled to an inverter 99 to drive the RDEC signal, which in turn drives the column driver 66b shown in FIG. 5(b) and the YSG signal distribution circuit 72 shown in FIG. 4.

The circuit also includes the INI1 and INI0 generation circuitry. Generally the circuit comprises a chain of series connected inverters 100 driven from a main INI signal line, and the INI0 and INI1 signals taken as taps along the chain.

Figure 7:
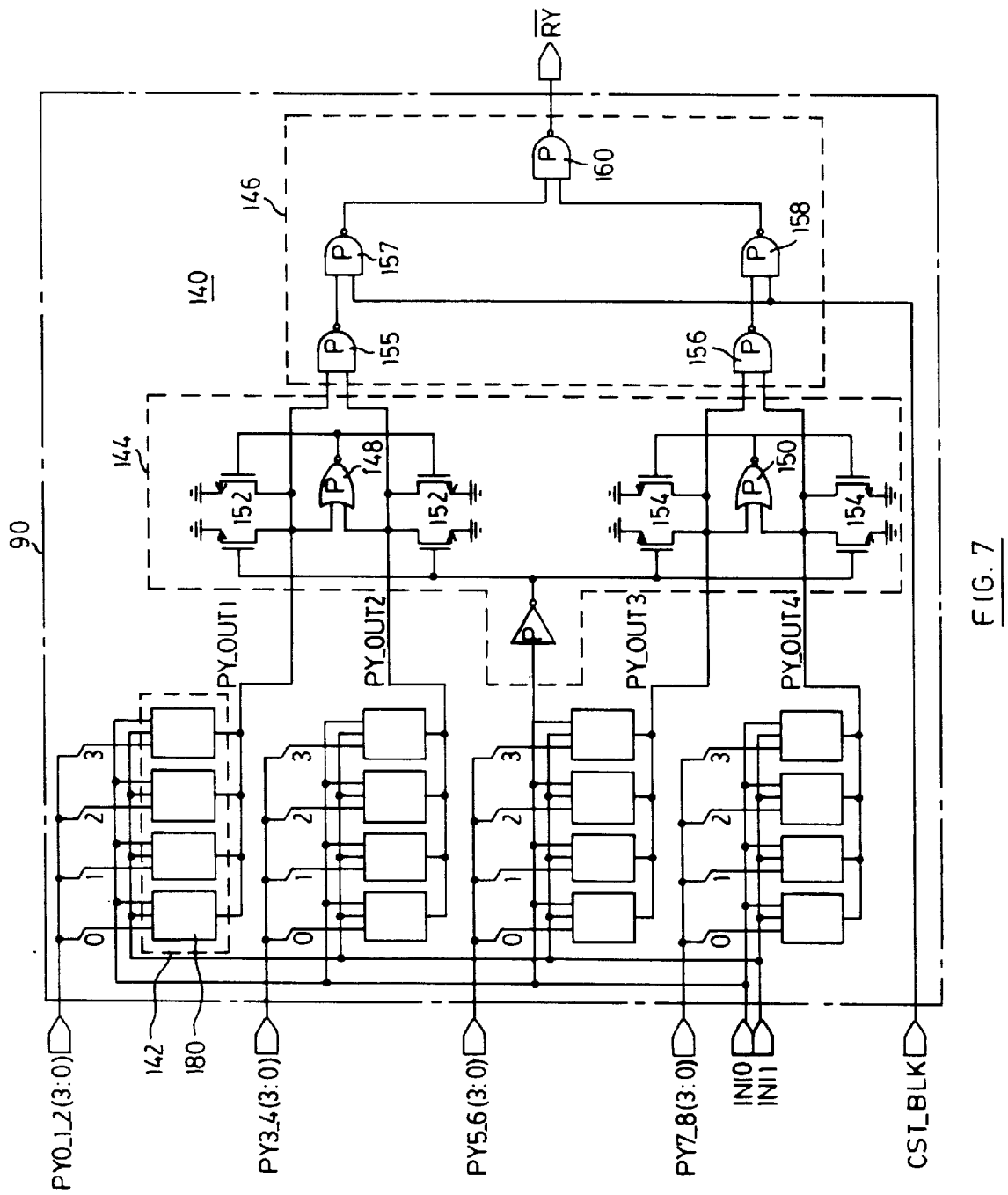
FIG. 7 is a schematic diagram of an address compare circuit according to an embodiment of the present invention.

Referring now to FIG. 7, the address compare circuit 90 of FIG. 6 is shown in detail. Since the predecoder (FIG. 4) has four groups of predecoded outputs: PY0_1_2, PY3_4, PY5_6 and PY7_8, the address-compare circuit comprises four groups of programmable fuse circuits 142. Each group 142 of fuse circuits includes four fuses with an associated fuse state evaluation circuit 180 shown in FIG. 8. The inputs to each of the constituent fuse evaluation circuits in a group are derived from the predecoded column address signals in each group, i.e., PY0_1_2, PY3_4, PY5_6 and PY7_8. The outputs PY_OUT from each of the fuses in a group 142 are combined to provide respective signals PY_OUT1, PY_OUT2, PY_OUT3 and PY_OUT4. These signals are passed through an initialization circuit 144 before being combined in an address combiner circuit 146. The address combiner circuit is essentially a four input NAND gate which outputs the redundant select signal $\overline{RY}$ shown in FIG. 6. Each of these circuit sections will now be discussed in detail.

The operation of the circuit 90 is as follows. If there are no defective columns and no need for redundancy, then no fuse circuits are blown, and the PY_OUT lines are all initialized to a logic low due to the initialization portion 144 of the circuit. This is in contrast with some of the prior art address-compare implementations where fuses of defective addresses were left intact while fuses of all non-defective columns were blown. That approach complicates the redundancy programming process considerably. The initialization circuit 144 is comprised of a pair of NOR gates 148 and 150, each connected to receive at its inputs a respective PY_OUT signal. Each of the NOR gate inputs are coupled to a respective NMOS transistor 152 and 154. The gates of these transistors are connected to their respective NOR gate output. Thus, with all the logic low PY_OUT inputs to the NOR gates 148, 150, the outputs of the NOR gates are logic high while the feedback connections via the feedback transistors further latch the inputs to logic low. The same logic low signals on lines PY_OUT are fed into NAND gates 155 and 156 thus producing logic highs at their outputs. The signal CST_BLK is a block redundancy test signal which is normally high, thus enabling NAND gates 157 and 158. With the outputs from NAND gate 155 and 156 at logic high and the CST_BLK signal at logic high, both outputs from NAND gates 157 and 158 are logic low, which in turn produce a logic high out of NAND gate 160, indicating that redundancy is not being used, i.e., $\overline{RY}$ is logic high.

Figure 1:
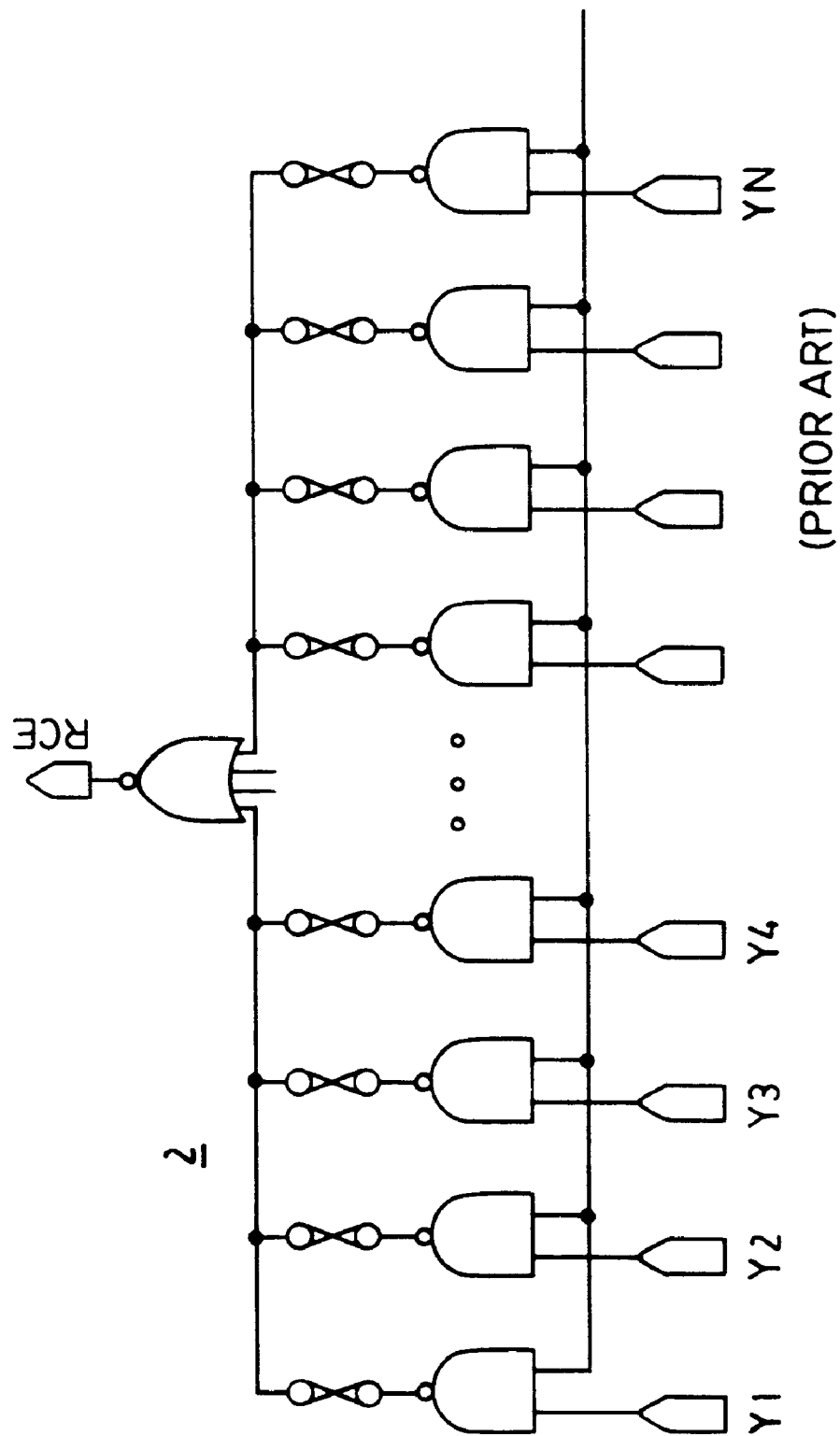
FIG. 1 illustrates a redundancy programming circuit according to the prior art.
Figure 2:
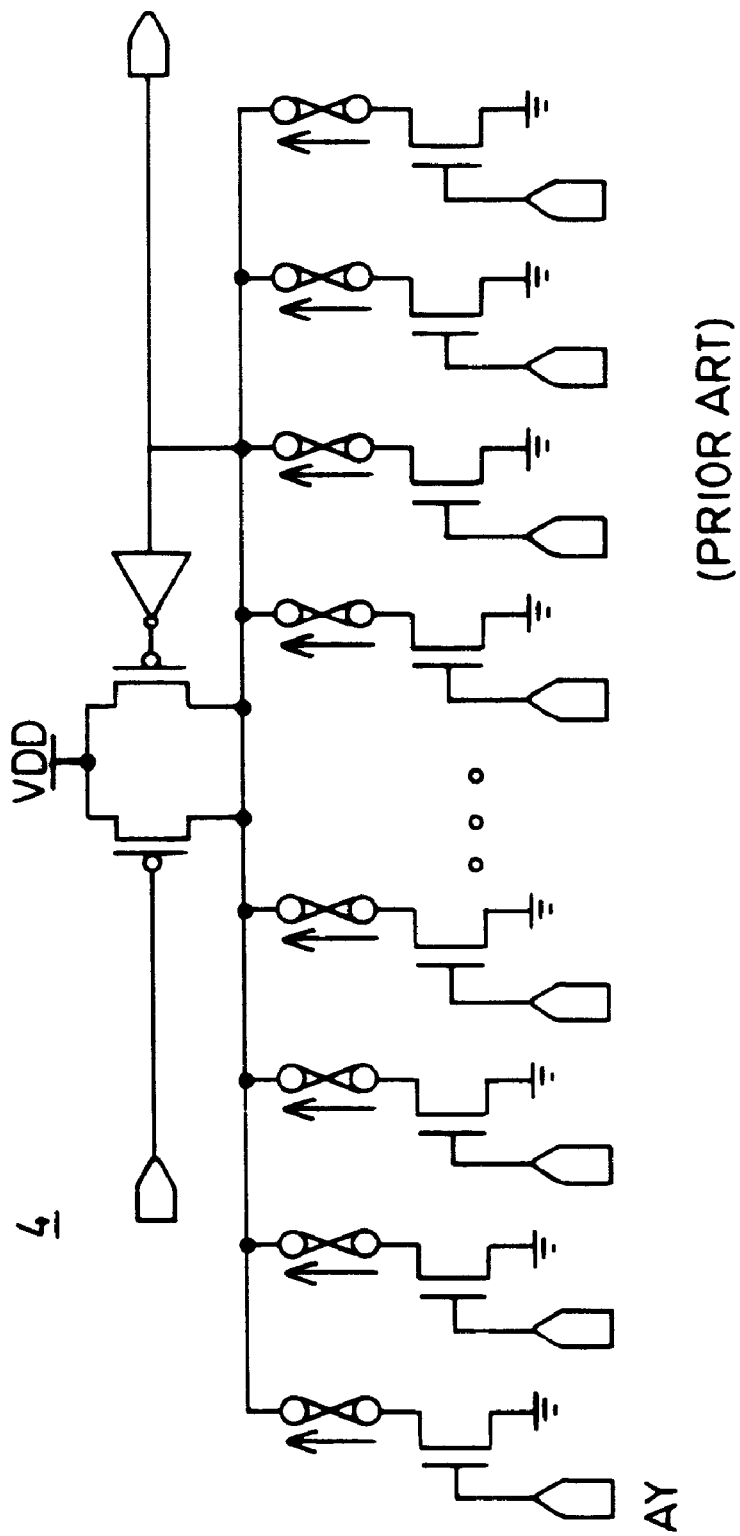
FIG. 2 indicates a further redundancy programming circuit according to the prior art.
Figure 3:
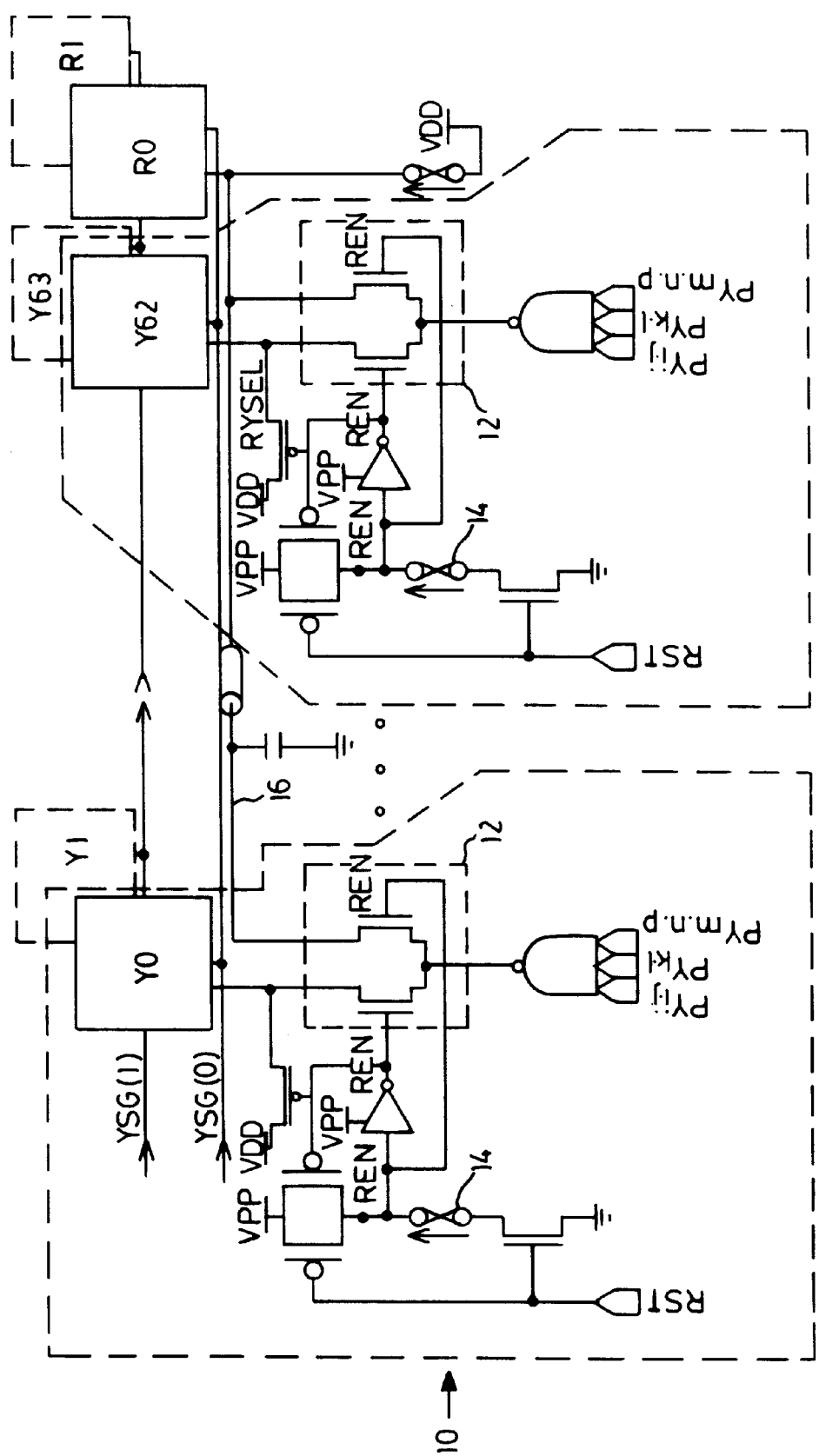
FIG. 3 is a schematic diagram of a redundancy address steering scheme according to the prior art.

If a faulty location is detected during testing, then the appropriate predecoder column address is programmed into each of the fuse circuit groups as described earlier. As a result, the programming signal lines PY_OUT1, PY_OUT2, PY_OUT3 and PY_OUT4 will all be set to logic high upon receipt of the predecoded signals since the address-compare circuit outputs will override the initialization devices; this process will be described in more detail below. Consequently, with two logic high inputs applied to the NAND gates 155 and 156, each then provides a logic low output, which when combined with a normal high CST_BLK signal in NAND gates 157 and 158, will provide logic high input signals to NAND gate 160, which in turn provides the active low output signal $\overline{RY}$, indicating the use of redundancy. It is important to note that in the embodiment of the present invention, firstly if no defective address is detected, no fuses need to be blown, whereas in the prior art address compare approach of FIG. 1, all fuses would have to be blown. Secondly, if a defective address is detected, to program a defective address, in the present invention embodiment no more than four (4) fuses must be blown compared to twelve (12) fuses for the prior art address-compare scheme. These differences represent a substantial simplification of the redundancy programming function.

Figure 8:
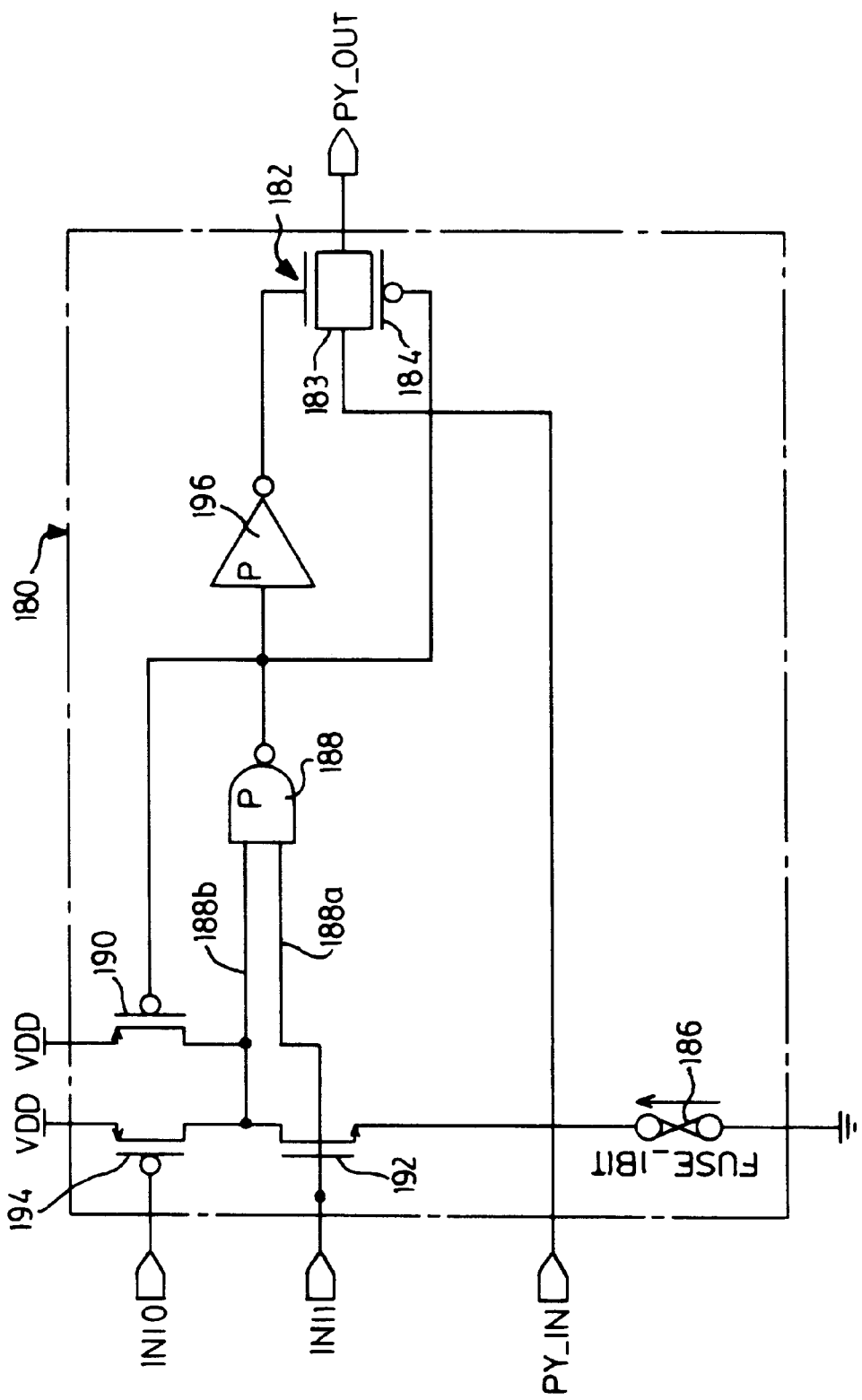
FIG. 8 is a schematic diagram of a fuse evaluation circuit according to an embodiment of the present invention.

Referring to FIG. 8, a detailed schematic of the fuse state evaluation circuit 180 of FIG. 7 is shown. As described above, the circuit 180 receives one of the predecoded address signals on its PY_IN terminal which is in turn connected to a CMOS pass gate 182 formed by a NMOS and PMOS transistor 183 and 184 respectively. The output of the CMOS pass gate 182 is the signal PY_OUT. The pass gates 183 and 184 are controlled by a fuse element 186. The initial conditions for the pass gate 182 are set by a NAND gate 188, which in turn has its initial conditions determined by its inputs received from signals INI0 and INI1. The INI0 and INI1 signals are slightly delayed versions of one another with INI0 preceding INI1, as shown in FIG. 6.

A feedback PMOS transistor 190 has its gate connected to output of NAND gate 188 and its drain connected to one of the inputs 188b of the NAND gate 188, forming a half-latch. The feedback transistor 190 is used to latch the programmed redundancy address. The INI1 signal is applied directly to the other input 188a of the NAND gate 188 and to the gate of an NMOS transistor 192 having its source connected to one end of the fuse 186 and the other end of which is connected to ground. The drain terminal of the NMOS transistor 192 is connected to the drain terminal of a PMOS transistor 194 which in turn has its source connected to the $V_{DD}$ supply. The INI0 signal is applied to the gate of the PMOS transistor 194. The common drain connection between the PMOS transistor 194 and the NMOS transistor 192 is connected to the first input 188b of the NAND gate 188. The output from the NAND gate 188 is connected via an inverter 196 to drive one of the pass gate transistors 183.

The fuse state is evaluated as follows. Signal INI0 and INI1 are generated from the POWER_OK signal and INI1 is delayed from INI0. Initially, both INI0 and INI1 are low and the CMOS transmission gate is open and the predecoded signal cannot be passed. In general operation, if the fuse is not blown, once both INI0 and INI1 have become high, the CMOS transmission gate keeps its open state. On the other hand, if the fuse is blown, the CMOS transmission gate is closed and the predecoded signal PY_IN is passed as a redundant predecoded address signal PY_OUT.

As previously mentioned with reference to FIG. 6, there is a delay between the transition of signals INI0 and INI1. The delay of INI1 from INI0 ensures that there is no DC current flowing from the supply voltage $V_{DD}$ through the fuse 186 to ground when the fuse is intact. As mentioned above, the feedback transistor 190 is used to latch the redundant state of the fuse circuit for the pass gate 182. Typically, in prior art circuits this PMOS device 190 is fairly long to allow easy resetability of the half latch. However, long channel transistors tend to consume more power and take up more area than ones with shorter channels. The role of the delayed initialization signals INI0 and INI1 also serves to reduce the size of the feedback transistor 190 to a normal size. This implementation therefore reduces the current consumption during fuse evaluation. Furthermore, the delayed activation of the INI0 and INI1 signals avoids a race condition is avoided as follows: if INI0 and INI1 were one and the same signal, during the transition from a low to a high, both devices 194 and 192 would be conducting. Since device 194 could achieve a faster pull-up than the pull-down through 192 due to the resistance of the fuse, node 188b would tend to remain high, and once INI1 would be sufficiently high, both inputs to NAND gate 188 would be high, pulling its output low and turning on transistor 190. But while transistor 190 would be turning on, transistor 192 would also be turned on, creating a path from VDD to ground, assuming the fuse is not blown. The race is therefore between the turning on of 194, 192 and 190. In contrast, by staggering the transition of INI0 and INI1, where INI0 goes from low to high first and then after a delay, INI1 also goes from low to high, the following operation avoids the race condition mentioned above. With INI0 initially low, device 194 is in the on state as power-up is occurring. As INI0 goes from low to high, device 194 turns off and node 188b is left to float at high temporarily. Note that due to the fact that INI1 is still low, the output of 188 is still high, and device 190 is in an off state. As INI1 begins its transition from low to high (no logic transitions can be instantaneous square-wave type transitions in actual operation, there will always be some slight delay resulting in more of a ramp-like transition), transistor 192 begins to turn on and node 188b is easily discharged since there is no contest with device 194. The result is that as INI1 (node 188a) is going from low to high, node 188b is going from floating high to low, and therefore, the output of NAND gate 188, as long as the fuse is not blown, will remain high, transistor 190 will not be turned on, and the pass gate 182 will remain off. As a result, the PY_IN signal will not be passed through the pass gate and the PY_OUT terminal signal will remain at its initialized state as described above.

If the fuse 186 is blown, then the input 188b of NAND gate 188 is not pulled to a logic low level. As a result, both input 188a and 188b of NAND gate 188 are at a logic high, resulting in a logic low output from the NAND gate. This logic low output is latched through the turning on of transistor 190 and enables the CMOS pass gate 182. As a result, for redundant operation (with the fuse blown), the pass gate 182 allows the signal PY_IN to pass through as signal PY_OUT and override the precharge value on the corresponding precharge line shown in FIG. 7. It is important to note that only fuses of faulty addresses need to be blown and not those of non-defective addresses.

Figure 9:
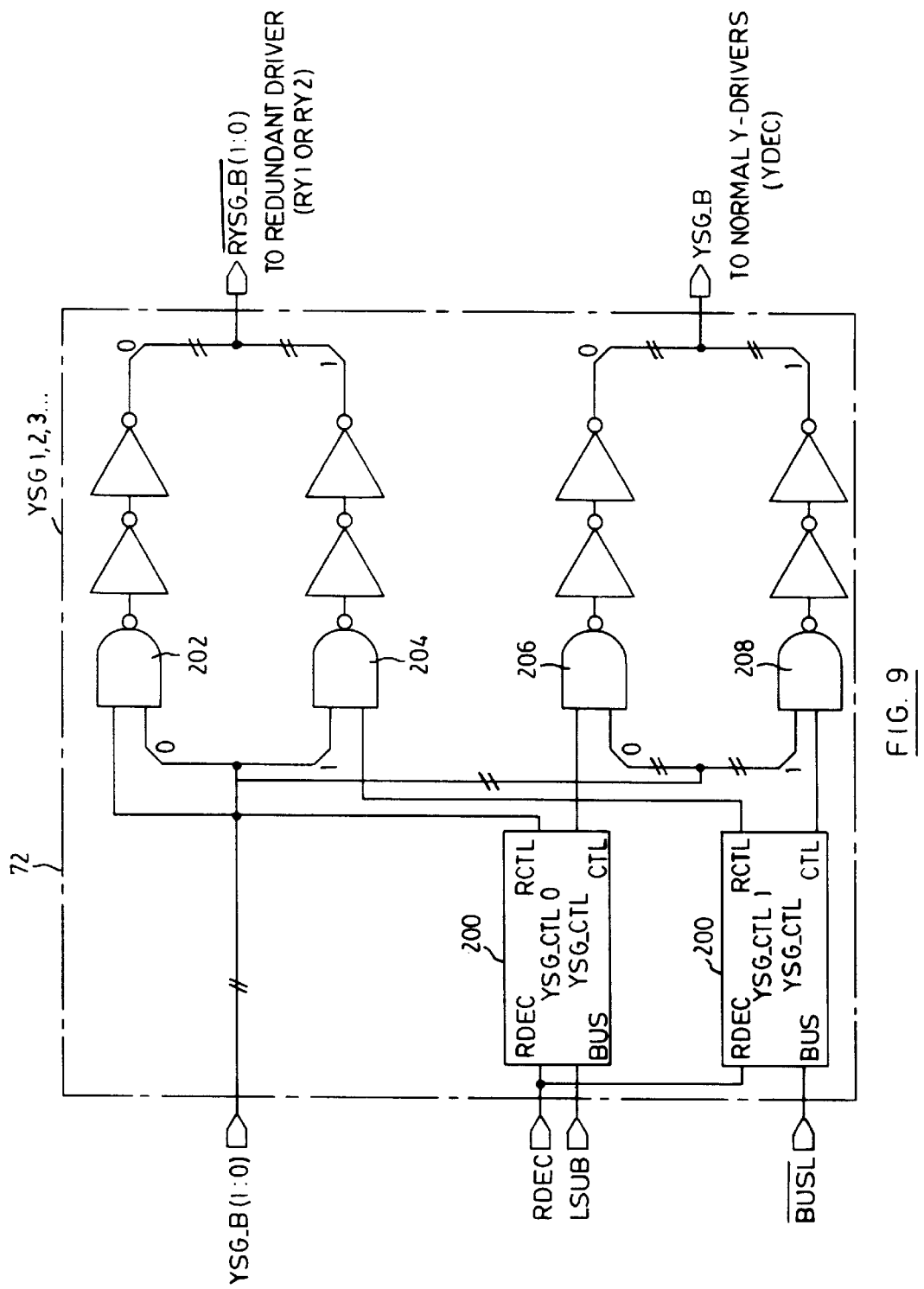
FIG. 9 is a schematic diagram of a column clock distribution circuit according to an embodiment of the present invention.

Referring to FIG. 9, the YSG switching circuit 72 (FIG. 4) is shown in detail. The switching circuit includes a pair of YSG latches 200 coupled to latch and delay the input RDEC signal. The YSG signal is held for two clock cycles due to the dual data bus architecture. The output $\overline{RYSG\_B(1:0)}$ and $\overline{YSG\_B(1:0)}$ are coupled to the redundant driver 70 and the normal Y drivers respectively. The RCTL (redundant decoder control) output from the latches 200 are coupled to an input of respective gates 202 and 204, while a CTL (decoder control) output is coupled to the inputs of a second pair of NAND gates 206 and 208. Both sets of NAND gates 202, 204 and 206, 208 receive the YSG signal on one of their other inputs. Referring to FIG. 10, the YSG latches 200 have their outputs RCTL and CTL of complementary polarity. Thus, the NAND gates 202, 204 and 206, 208 are responsible for switching the YSG signal to either RYSG_B or YSG_B.

While the invention has been described in connection with the specific embodiment thereof, and in a specific use, various modifications thereof will occur to those skilled in the art without departing from the spirit of the invention as set forth in the appended claims. For example, the number of redundant Y drivers associated with a group of normal Y drivers may be varied. Furthermore, the column redundancy system may be applied to all types of RAMs such as DRAMs, SDRAMs, SGRAMs, and the like. Similarly, by making well-known amendments to the circuitry, the redundancy system described herein could also be adapted to implement row redundancy.

The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

The embodiments of the invention in which an exclusive property or privilege is claimed are defined as follows:

1. A semiconductor memory device comprising:
   a) a plurality of blocks each containing memory elements arranged in rows and columns, the memory elements being activated by applying column and row address signals to respective columns and rows, and the blocks being selectively activated by a block selection signal;
   b) A normal column driver for enabling at least one normal column in response to a decoded memory address signal received at an input thereof;
   c) a redundant column driver selectable for enabling at least one redundant column, in response to a redundant column address signal received at an input thereof;
   d) switch means responsive to said redundant column address signal for selectively enabling the redundant column driver and for disabling the normal column driver associated with the defective normal column; and
   e) a redundancy decoder for generating said redundant column address signal in response to a programmed defective memory address and said block selection signal, whereby the redundant column may replace a defective column in any one of said blocks.

2. A semiconductor memory device defined in claim 1, including a pass gate switch for coupling a selected redundant column to a databus in response to a core I/O control signal.

3. A semiconductor memory device comprising:
   a) memory elements arranged in rows and columns, said memory elements being accessible by applying column and row address signals to associated columns or rows respectively;
   b) normal column drivers for enabling normal columns associated therewith, the normal column drivers being responsive to decoded memory address signals received at respective inputs thereof for enabling the columns;
   c) a redundant column driver for enabling at least one redundant column associated therewith, in response to a decoded memory address signal received at an input thereof for enabling the redundant column; and
   d) switch means responsive to a signal indicative of a defective normal column for selectively enabling the redundant column driver and associated with the defective normal column and providing data to and from an associated redundant column, whereby there is substantially no difference in timing between the normal and redundant column memory address signal paths.

4. A semiconductor memory device comprising:
   a) a plurality of normal columns selectively enabled by normal column decoders;
   b) redundant memory columns selectively enabled by redundant column decoders, the normal and redundant decoders being responsive to a column clock signal; and
   c) local signal distribution circuitry for switching said column clock signal to either a normal driver or to the redundancy driver in response to an output from the redundant column decoder.

5. A semiconductor memory device as defined in claim 4, wherein the redundant column decoder is an address comparison decoder.

6. A semiconductor memory device comprising:
   a) memory elements arranged in rows and columns, the memory elements being accessible by applying column and row address signals to associated columns or rows respectively;
   b) normal column drivers for enabling normal columns associated therewith, the normal column drivers being responsive to decoded memory address signals received at respective inputs thereof for enabling the columns;
   c) a redundant decoder for accessing a redundant column, the redundant column decoder including at least two address-compare circuits each capable of being programmed with a column address, the redundant column decoder selectively outputting a signal indicative of a defective normal column provided by one of the at least two address-compare circuits in response to row address signal;
   d) a redundant column driver for enabling at least one redundant column associated therewith, in response to the signal indicative of a defective normal column; and
   e) switch means responsive to the signal indicative of a defective normal column for selectively enabling the redundant column driver and disabling the normal column driver associated with the defective column, whereby there is substantially no difference in timing between the normal and redundant column memory address signal paths.

7. A semiconductor memory device comprising:
   a) memory elements arranged in rows and columns, the memory elements being accessible by applying column and row address signals to associated columns or rows respectively;
   b) normal column drivers for enabling normal columns associated therewith, the normal column drivers being responsive to decoded memory address signals received at respective inputs thereof for enabling the columns;
   c) redundant column drivers for enabling redundant columns associated therewith, in response to a decoded memory address signal received at respective inputs thereof for enabling at least one redundant column in any of a plurality memory array blocks;
   d) means for generating data path control signals, the data path control signals being active in a memory block selected by a block selection signal when no redundancy column driver within the plurality of memory array blocks is enabled, the data path control signals being active in a memory array block in which a redundancy column driver is enabled, irrespective of the block selection signal, when at least one redundancy column decoder within the plurality of memory blocks is enabled; and
   e) switch means responsive to the signal indicative of a defective normal column for selectively enabling the redundant column driver and disabling the normal column driver associated with the defective column, whereby there is substantially no difference in timing between the normal and redundant column memory address signal paths.

* * * * *